(12) United States Patent
Tsukamoto et al.

(10) Patent No.: US 9,985,475 B2
(45) Date of Patent: May 29, 2018

(54) POWER SUPPLY APPARATUS AND METHOD

(71) Applicant: CANON KABUSHIKI KAISHA, Tokyo (JP)

(72) Inventors: Nobuyuki Tsukamoto, Tokyo (JP); Katsuya Nakano, Yokohama (JP); Marie Tateno, Munich (DE)

(73) Assignee: Canon Kabushiki Kaisha, Tokyo (JP)

( * ) Notice: Subject to any disclaimer, the term of this patent is extended or adjusted under 35 U.S.C. 154(b) by 228 days.

(21) Appl. No.: 14/948,520

(22) Filed: Nov. 23, 2015

(65) Prior Publication Data

US 2016/0156199 A1    Jun. 2, 2016

(30) Foreign Application Priority Data

Nov. 27, 2014  (JP) ................................ 2014-240623

(51) Int. Cl.
*H02J 17/00* (2006.01)
*G01R 31/40* (2014.01)

(52) U.S. Cl.
CPC .............. *H02J 17/00* (2013.01); *G01R 31/40* (2013.01)

(58) Field of Classification Search
CPC .................................. H02J 17/00; G01R 31/40
See application file for complete search history.

(56) References Cited

U.S. PATENT DOCUMENTS

| | | | | |
|---|---|---|---|---|
| 5,854,481 A * | 12/1998 | Ricotti | ............... | H03K 17/6874 235/380 |
| 6,321,067 B1 * | 11/2001 | Suga | .................... | G06K 7/0008 455/106 |
| 8,359,073 B2 * | 1/2013 | Kamiyama | ............. | H02J 7/025 307/104 |
| 8,643,219 B2 * | 2/2014 | Yabe | ................... | H01F 27/2804 307/104 |
| 8,760,006 B2 * | 6/2014 | Lee | ....................... | G06K 7/0008 307/104 |
| 8,983,374 B2 * | 3/2015 | Wiley | .................. | H04B 5/0031 455/41.1 |
| 9,124,114 B2 * | 9/2015 | Haruyama | ............... | H02J 5/005 |
| 9,154,003 B2 * | 10/2015 | Ichikawa | ................ | H02J 5/005 |
| 9,264,108 B2 * | 2/2016 | Von Novak, III | ... | H04B 5/0037 |
| 9,425,865 B2 * | 8/2016 | Lee | ....................... | H04B 5/0081 |
| 9,509,374 B2 * | 11/2016 | Kim | ....................... | H02J 7/025 |
| 9,625,501 B2 * | 4/2017 | Van Wageningen | ... | G01R 21/00 |
| 2008/0039903 A1 * | 2/2008 | Chadwick | .......... | A61N 1/37276 607/61 |

(Continued)

FOREIGN PATENT DOCUMENTS

JP  2008-113519 A  5/2008

*Primary Examiner* — Thomas J Hiltunen
(74) *Attorney, Agent, or Firm* — Canon U.S.A., Inc. IP Division

(57) ABSTRACT

A power supply apparatus includes a power supply unit that outputs first power used for wireless communication or second power used for wireless power supply, a communication unit that performs a wireless communication by modulating the first power output from the power supply unit, and a control unit that controls the second power output from the power supply unit in a manner that a predetermined condition corresponding to a test mode is satisfied, in a case where the power supply apparatus is in the test mode.

13 Claims, 12 Drawing Sheets

(56) References Cited

U.S. PATENT DOCUMENTS

| | | | |
|---|---|---|---|
| 2013/0134927 A1* | 5/2013 | Park | H04B 5/0037 320/107 |
| 2015/0065041 A1* | 3/2015 | Ahn | H02J 5/005 455/41.1 |
| 2015/0236544 A1* | 8/2015 | Uchida | H02J 7/025 343/860 |
| 2015/0280429 A1* | 10/2015 | Makita | H02H 3/20 361/86 |
| 2015/0341087 A1* | 11/2015 | Moore | H04B 5/0031 455/77 |
| 2016/0087689 A1* | 3/2016 | Fukaya | H04B 5/0031 307/104 |
| 2016/0156231 A1* | 6/2016 | Shibuya | H04B 5/0037 455/82 |

\* cited by examiner

POWER SUPPLY APPARATUS AND METHOD

BACKGROUND

Field of the Invention

The present invention relates to a power supply apparatus that outputs power to an outside of the power supply apparatus, and the like.

Description of the Related Art

In recent years, a wireless power supply system has been proposed which includes a power supply apparatus that wirelessly outputs power without being connected by a connector and an electronic device that charges a battery with power wirelessly supplied from the power supply apparatus. With regard to the above-described wireless power supply system, a power supply apparatus has been proposed in which a communication between the power supply apparatus and the electronic device and power transmission from the power supply apparatus to the electronic device are performed via the same antenna (Japanese Patent Laid-Open No. 2008-113519).

SUMMARY

The power supply apparatus is supposed to determine whether or not a device placed in the vicinity of the power supply apparatus is an electronic device corresponding to a wireless power supply method executed by the power supply apparatus by using information obtained through a communication with the device placed in the vicinity of the power supply apparatus. Furthermore, the power supply apparatus is supposed to determine whether or not the electronic device corresponding to the wireless power supply method needs wireless power supply by using the information obtained through the communication with the electronic device corresponding to the wireless power supply method executed by the power supply apparatus. The power supply apparatus is supposed to determine, when it is determined that the electronic device corresponding to the wireless power supply method executed by the power supply apparatus needs the wireless power supply based on the wireless power supply method, that authentication for the wireless power supply to the electronic device is completed to start the wireless power supply to the electronic device.

In a case where the above-described power supply apparatus is shipped from a factory, a test is supposed to be conducted as to whether or not the power supply apparatus can appropriately wirelessly supply power to the electronic device corresponding to the wireless power supply method executed by the power supply apparatus. To test a wireless power supply capability of the above-described power supply apparatus in the factory, the electronic device corresponding to the wireless power supply method executed by the power supply apparatus needs to be prepared, and also the authentication for performing the wireless power supply based on the wireless power supply method needs to be performed between the power supply apparatus and the electronic device, which is inconvenient. This is because, otherwise, the power supply apparatus does not start the wireless power supply based on the wireless power supply method, and a manufacturer does not test the wireless power supply capability of the power supply apparatus.

Furthermore, to test the wireless power supply capability of the above-described power supply apparatus in the factory, an authentication process for performing the wireless power supply based on the wireless power supply method between the power supply apparatus and the electronic device needs to be completed. When it is supposed that this authentication process takes time, a problem occurs that much time is needed to test the wireless power supply capability of the single power supply apparatus.

According to an aspect of the present invention, an apparatus or a method with which time used for testing a power supply apparatus can be reduced is provided.

According to an aspect of the present invention, an apparatus or a method with which a power supply apparatus can be efficiently tested is provided.

According to an aspect of the present invention, there is provided a power supply apparatus including: a power supply unit that outputs first power used for wireless communication or second power used for wireless power supply; a communication unit that performs a wireless communication by modulating the first power output from the power supply unit; and a control unit that controls the second power output from the power supply unit in a manner that a predetermined condition corresponding to a test mode is satisfied, in a case where the power supply apparatus is in the test mode.

According to an aspect of the present invention, there is provided a method including: causing a power supply unit to output first power used for wireless communication or second power used for wireless power supply; performing a wireless communication by modulating the first power output from the power supply unit; and controlling the second power output from the power supply unit in a manner that a predetermined condition corresponding to a test mode is satisfied, in a case where the power supply apparatus is in the test mode.

According to an aspect of the present invention, there is provided a non-transitory storage medium that stores a program for causing a computer to execute a method, the method including: causing a power supply unit to output first power used for wireless communication or second power used for wireless power supply; performing a wireless communication by modulating the first power output from the power supply unit; and controlling the second power output from the power supply unit in a manner that a predetermined condition corresponding to a test mode is satisfied, in a case where the power supply apparatus is in the test mode.

Further features and aspects of the present invention will become apparent from the following description of exemplary embodiments.

DESCRIPTION OF THE EMBODIMENTS

Exemplary embodiments, features, and aspects of the present invention will be described below with reference to the drawings. It should be noted that the present invention is not intended to be limited to a first exemplary embodiment that will be described below.

First Exemplary Embodiment

Figure 1:
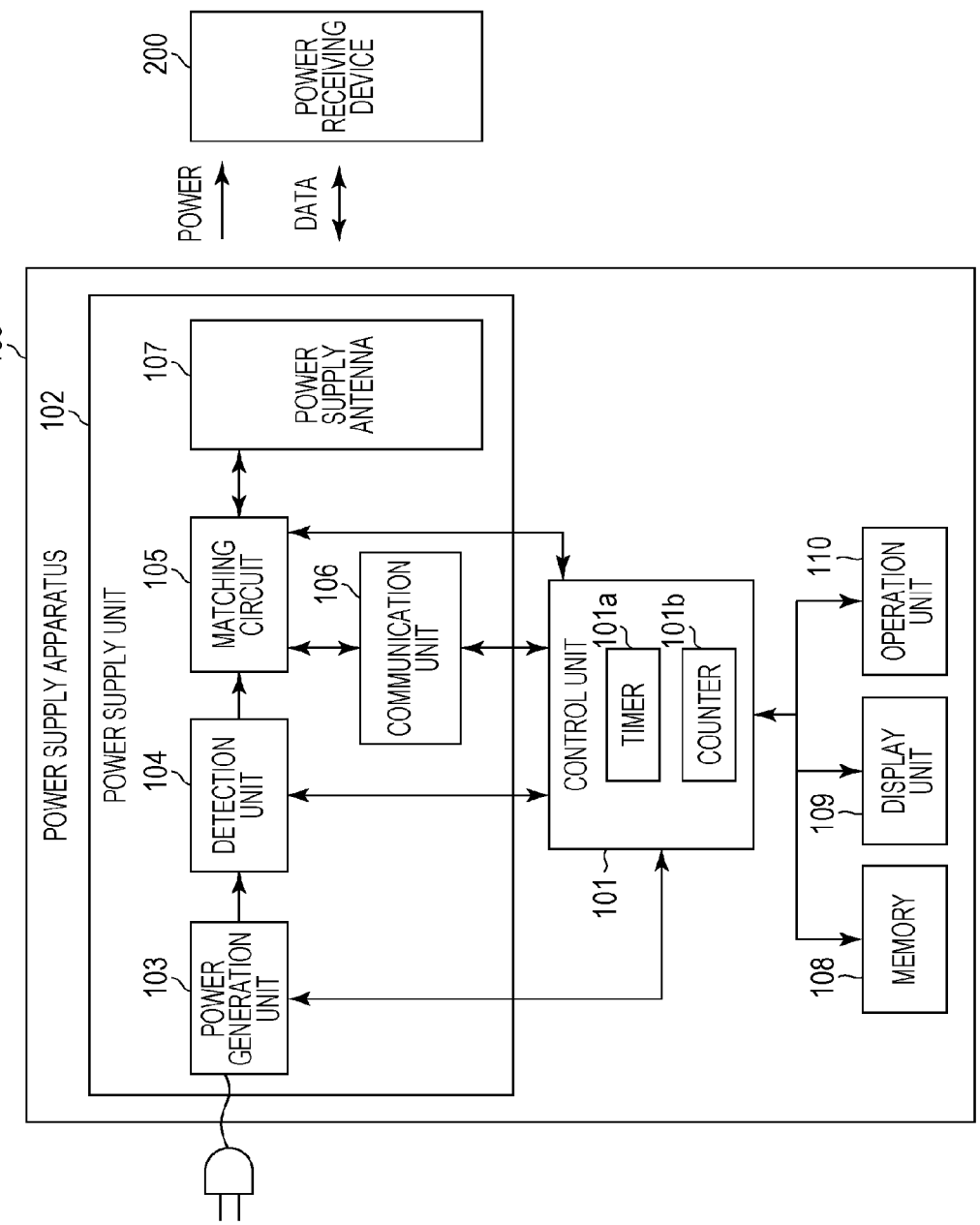
FIG. 1 is a block diagram illustrating examples of components included in a power supply apparatus according to a first exemplary embodiment.

FIG. 1 is a block diagram illustrating examples of components included in a power supply apparatus 100 according to the first exemplary embodiment. As illustrated in FIG. 1, the power supply apparatus 100 includes a control unit 101, a power supply unit 102, a memory 108, a display unit 109 and an operation unit 110. The power supply unit 102 includes a power generation unit 103, a detection unit 104, a matching circuit 105, a communication unit 106, and a power supply antenna 107.

The control unit 101 executes a computer program stored in the memory 108 to control the power supply apparatus 100. The control unit 101 includes, for example, a central processing unit (CPU). The control unit 101 is constituted by hardware. The control unit 101 includes a timer 101a and a counter 101b.

The power supply unit 102 is used to perform wireless power supply on the basis of a predetermined power supply method. The predetermined power supply method is, for example, a power supply method using a magnetic resonance system. According to the magnetic resonance system, power is transmitted from the power supply apparatus 100 to the power receiving device 200 in a state in which resonance occurs between the power supply apparatus 100 and a power receiving device 200 corresponding to a target of the wireless power supply of the power supply apparatus 100. The state in which the resonance occurs between the power supply apparatus 100 and the power receiving device 200 refers to a state in which a resonance frequency of the power supply apparatus 100 is matched with a resonance frequency of the power receiving device 200. The predetermined power supply method may be a power supply method using a system other than the magnetic resonance system, and an electromagnetic induction system may be adopted.

The power generation unit 103 generates power to be output to an outside of the power supply apparatus 100 via the power supply antenna 107 by using power supplied from an AC power source.

Power generated by the power generation unit 103 includes first power used for wireless communication (referred to as WC power) and second power used for wireless power supply (referred to as WPS power). The WC power is used for the communication unit 106 to perform a wireless communication. The WC power is feeble power, for example, at 1 W or lower. It should be noted that the WC power may be power specified in the communication protocol of the communication unit 106. The WPS power is used for the power receiving device 200 to charge a battery or to perform a specific operation. A value of the WPS power is set by the control unit 101.

The power generated by the power generation unit 103 is supplied to the power supply antenna 107 via the detection unit 104 and the matching circuit 105.

The detection unit 104 detects a voltage standing wave ratio (VSWR). Furthermore, the detection unit 104 supplies data indicating the detected VSWR to the control unit 101. The VSWR is a value representing a relationship between a traveling wave of power output from the power supply antenna 107 to the outside of the power supply apparatus 100 and a reflected wave of power output from the power supply antenna 107 to the outside of the power supply apparatus 100. The control unit 101 can detect whether or not at least one power receiving device 200 exists in a predetermined range by using the data indicating the VSWR supplied from the detection unit 104. In addition, the control unit 101 can detect whether or not a foreign substance exists by using the data indicating the VSWR supplied from the detection unit 104.

The matching circuit 105 includes a circuit that sets the resonance frequency of the power supply apparatus 100. The matching circuit 105 includes at least one of a capacitance and a coil used to set the resonance frequency of the power supply apparatus 100. In a case where the power supply apparatus 100 outputs one of the WC power and the WPS power via the power supply antenna 107, the control unit 101 controls the matching circuit 105 such that the resonance frequency of the power supply apparatus 100 is set as a predetermined frequency f. The predetermined frequency f is, for example, 13.56 MHz.

The communication unit 106 performs a wireless communication, for example, on the basis of NFC communication protocol standards specified by Near Field Communication (NFC) Forum. The communication unit 106 transmits data to the power receiving device 200 and receives data from the power receiving device 200.

The communication unit 106 superimposes the data with the WC power by performing an amplitude shift keying (ASK) modulation on the WC power generated by the power generation unit 103. In a case where the ASK modulation is performed on the WC power, data "1" and data "0" are superimposed on the WC power to be output from the power supply antenna 107. The power receiving device 200 receives the data included in the received WC power and uses a part of the received WC power to transmit a reply to the data received from the power supply apparatus 100 to the power supply apparatus 100.

The communication unit 106 is in conformity to Type A standard, Type B standard, and Type F standard specified by NFC standards.

The Type A standard is a communication standard in which the data is transmitted by performing the ASK modulation on the WC power at a modulation rate of 100%. A bit rate when the data is transmitted on the basis of the Type A standard is 106 kbps.

The Type B standard is a communication standard in which the data is transmitted by performing the ASK modulation on the WC power at the modulation rate of 10%. The bit rate when the data is transmitted on the basis of the Type B standard is 106 kbps.

The Type F standard is a communication standard in which the data is transmitted by performing the ASK modulation on the WC power at the modulation rate of 10%. The bit rate when the data is transmitted on the basis of the Type F standard is 212 kbps or 424 kbps.

The communication unit 106 performs the wireless communication on the basis of a communication protocol of the NFC standards during a period in which the WC power is output from the power supply antenna 107. However, the communication unit 106 does not perform the wireless communication during a period in which the WPS power is output from the power supply antenna 107 on the basis of the communication protocol of the NFC standards.

The power supply antenna 107 is an antenna that outputs one of the WPS power and the WC power. In addition, the power supply antenna 107 is used for the communication unit 106 to perform the wireless communication using the NFC standards.

The memory 108 stores the computer program for controlling the power supply apparatus 100. The memory 108 also stores the data received by the communication unit 106. Furthermore, the memory 108 stores identification data of the power supply apparatus 100, a power supply parameter related to the power supply apparatus 100, a flag for controlling the power supply, and the like. For example, the memory 108 stores information indicating a maximum value of power that can be output to the outside of the power supply apparatus 100 by the power supply apparatus 100. The information indicating the maximum value of power that can be output to the outside of the power supply apparatus 100 by the power supply apparatus 100 is, for example, information indicating which power class the power supply apparatus 100 is based on. A low power class, a middle power class, and a high power class are specified as the power class. The low power class is information indicating, for example, that the maximum value of power that can be output to the outside of the power supply apparatus 100 is 1 [W]. The middle power class is information indicating, for example, that the maximum value of power that can be output to the outside of the power supply apparatus 100 is 5 [W]. The high power class is information indicating, for example, that the maximum value of power that can be output to the outside of the power supply apparatus 100 is 10 [W].

For example, in a case where the maximum value of power that can be output to the outside of the power supply apparatus 100 by the power supply apparatus 100 is 1 [W], the memory 108 stores the information indicating that the power supply apparatus 100 is based on the low power class. For example, in a case where the maximum value of power that can be output to the outside of the power supply apparatus 100 by the power supply apparatus 100 is 5 [W], the memory 108 stores the information indicating that the power supply apparatus 100 is based on the middle power class. For example, in a case where the maximum value of power that can be output to the outside of the power supply apparatus 100 by the power supply apparatus 100 is 10 [W], the memory 108 stores the information indicating that the power supply apparatus 100 is based on the high power class.

The display unit 109 displays image data supplied from the memory 108.

The operation unit 110 provides a user interface for operating the power supply apparatus 100. The operation unit 110 includes a button, a switch, a touch panel, and the like for operating the power supply apparatus 100. The control unit 101 controls the power supply apparatus 100 in accordance with an input signal input via the operation unit 110.

In the above-described explanations, the power supply apparatus 100 wirelessly supplies the power. However, in the present specification, "wireless" may be rephrased as "contactless" or "non-contact".

The power supply apparatus 100 has a power supply mode, a first test mode, a second test mode, a third test mode, and the fourth test mode as an operation mode.

The power supply mode is a mode for the power supply apparatus 100 to perform the wireless power supply to the power receiving device 200 in a case where the power receiving device 200 exists in a predetermined range. In a case where the power receiving device 200 is placed in the predetermined range, the power receiving device 200 is an apparatus that can perform the wireless communication with the power supply apparatus 100 and receive the power from the power supply apparatus 100 via a power receiving antenna. The predetermined range is set as a range in which the power supply apparatus 100 can perform the wireless communication with the power receiving device 200. It should be noted that, in a case where the power supply apparatus 100 is in the power supply mode, the power supply apparatus 100 may also be an apparatus that can perform the wireless power supply to power receiving devices. The power receiving device 200 may be an image pickup apparatus or a reproduction apparatus, or may also be a communication apparatus such as a mobile phone or a smart phone. In addition, the power receiving device 200 may be a battery pack including a battery. Moreover, the power receiving device 200 may be an automobile or a display, or may also be a personal computer.

The first test mode is a mode used for measuring at least one of an electric field intensity and a magnetic field intensity of the WC power output from the power supply apparatus 100 in a case where the power supply apparatus 100 performs the wireless communication based on the communication protocol of the NFC standards.

The second test mode is used for measuring at least one of the electric field intensity and the magnetic field intensity of the WPS power output from the power supply apparatus 100 in a case where the power supply apparatus 100 performs the wireless power supply.

The third test mode is used for measuring at least one of the electric field intensity and the magnetic field intensity of power in a case where the WC power and the WPS power are output from the power supply apparatus 100 in a time division manner.

The fourth test mode is used for measuring at least one of the electric field intensity and the magnetic field intensity of power in a case where the WC power and the WPS power are output from the power supply apparatus 100 in a time division manner. The fourth test mode is a mode different from the third test mode.

In a case where the test is performed to determine whether or not the power supply apparatus 100 can appropriately perform the wireless power supply to the power receiving device 200, a measurement device is installed at a position away from the power supply apparatus 100 by a predetermined distance. The measurement device is a device that measures at least one of the electric field intensity and the magnetic field intensity. The measurement device measures at least one of the electric field intensity and the magnetic field intensity of power output from the power supply apparatus 100 put into one of the first test mode, the second test mode, the third test mode, and the fourth test mode. Thereafter, in accordance with the measurement result by the measurement device, it is determined as to whether or not the power supply apparatus 100 can appropriately perform the wireless power supply to the power receiving device 200. For example, in a case where the measurement result by the measurement device is compliant with specifications of Japanese Radio Law, it is determined that the power supply apparatus 100 is an apparatus that can appropriately perform the wireless power supply to the power receiving device 200. In a case where the measurement result by the measurement device is compliant with specifications of European Telecommunications Standards Institute (ETSI), it is determined that the power supply apparatus 100 is an apparatus that can appropriately perform the wireless power supply to the power receiving device 200. In addition, for example, in a case where the measurement result by the measurement device is compliant with specifications of Federal Communications Commission (FCC), it is determined that the power supply apparatus 100 is an apparatus that can appropriately perform the wireless power supply to the power receiving device 200.

Test Process

Figure 2:
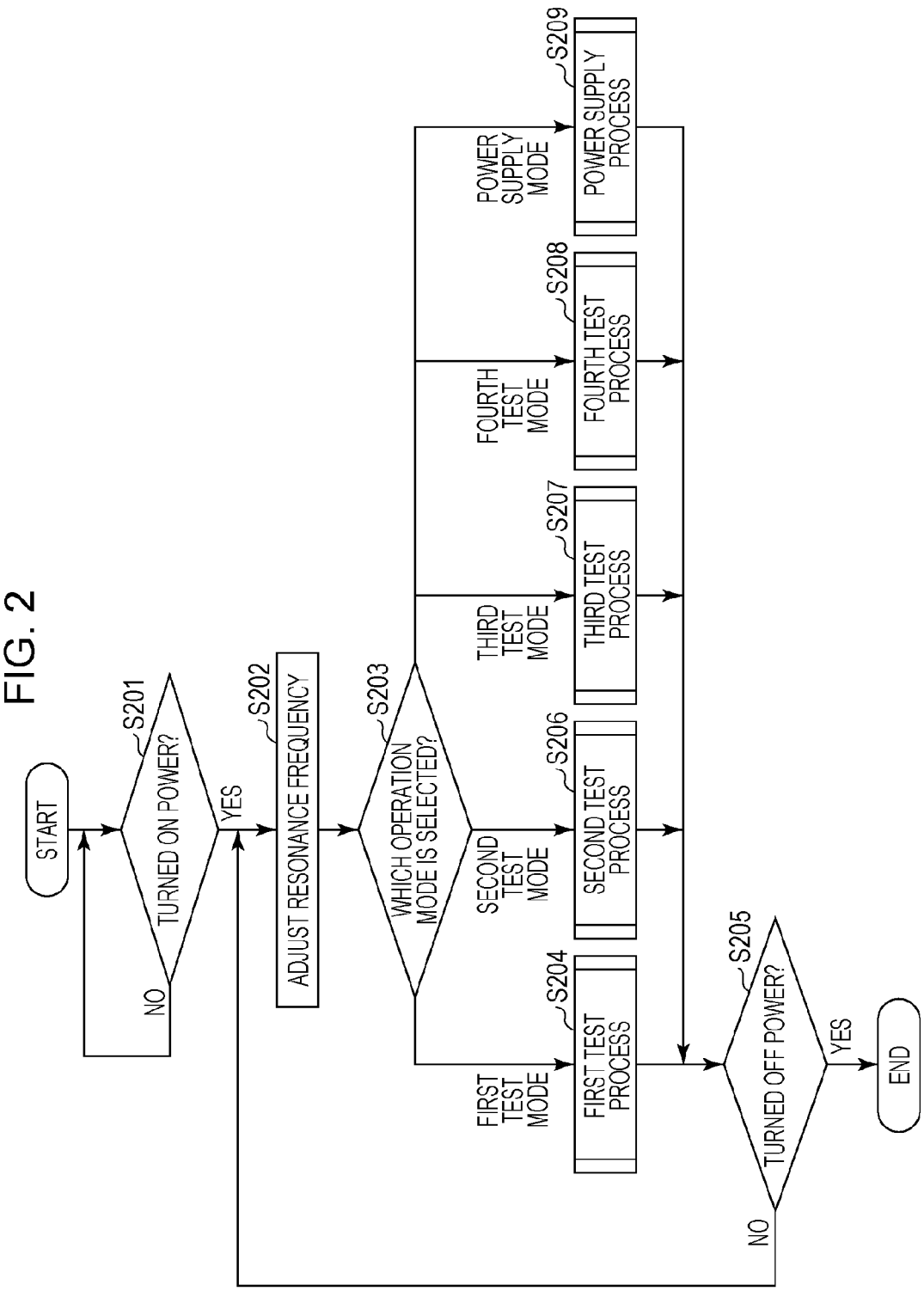
FIG. 2 is a flow chart illustrating an example of a test process according to the first exemplary embodiment.

Next, with reference to FIG. 2, a test process performed by the control unit 101 will be described. It should be noted that the test process illustrated in FIG. 2 can be realized while the control unit 101 executes the computer program stored in the memory 108.

In S201, the control unit 101 determines whether or not the power supply apparatus 100 is turned ON via the operation unit 110. In a case where the power supply apparatus 100 is not turned ON via the operation unit 110 (S201: No), the control unit 101 repeatedly performs S201. In a case where the power supply apparatus 100 is turned ON via the operation unit 110 (S201: Yes), the control unit 101 performs S202.

In S202, the control unit 101 controls the matching circuit 105 such that the resonance frequency of the power supply apparatus 100 is set as the predetermined frequency f. Thereafter, the control unit 101 performs S203.

In S203, the control unit 101 determines whether or not which mode is selected as the operation mode of the power supply apparatus 100 via the operation unit 110. In a case where the first test mode is selected as the operation mode of the power supply apparatus 100, the control unit 101 performs S204. In a case where the second test mode is selected as the operation mode of the power supply apparatus 100, the control unit 101 performs S206. In a case where the third test mode is selected as the operation mode of the power supply apparatus 100, the control unit 101 performs S207. In a case where the fourth test mode is selected as the operation mode of the power supply apparatus 100, the control unit 101 performs S208. In a case where the power supply mode is selected as the operation mode of the power supply apparatus 100, the control unit 101 performs S209.

In S204, the control unit 101 performs a first test process that will be described below. After the first test process is performed, the control unit 101 performs S205.

In S205, the control unit 101 determines whether or not the power supply apparatus 100 is turned OFF via the operation unit 110. In a case where the power supply apparatus 100 is not turned OFF via the operation unit 110 (S205: No), the control unit 101 returns to S202. In a case where the power supply apparatus 100 is turned OFF via the operation unit 110 (S205: Yes), the control unit 101 ends the test process illustrated in FIG. 2.

In S206, the control unit 101 performs a second test process that will be described below. After the second test process is performed, the control unit 101 performs S205. In S207, the control unit 101 performs a third test process that will be described below. After the third test process is performed, the control unit 101 performs S205. In S208, the control unit 101 performs a fourth test process that will be described below. After the fourth test process is performed, the control unit 101 performs S205. In S209, the control unit 101 performs a power supply process that will be described below. After the power supply process is performed, the control unit 101 performs S205.

First Test Process

Next, with reference to FIG. 3, the first test process performed by the control unit 101 in S204 will be described. It should be noted that the first test process illustrated in FIG. 3 can be realized while the control unit 101 performs the computer program stored in the memory 108.

In S301, the control unit 101 resets the counter 101b. Thereafter, the control unit 101 performs S302. In S302, the control unit 101 controls the power supply unit 102 such that the WC power is output via the power supply antenna 107. Thereafter, the control unit 101 performs S303. In S303, the control unit 101 performs a modulation process that will be described below. After the modulation process is performed, the control unit 101 performs S304.

In S304, the control unit 101 controls the counter 101b such that 1 is added to a value A indicating the execution number by the control unit 101 in S303. Thereafter, the control unit 101 performs S305.

In S305, the control unit 101 determines whether or not the counted value A by the counter 101b is higher than or equal to a first count number. In a case where the counted value A by the counter 101b is higher than or equal to the first count number (S305: Yes), the control unit 101 performs S306. In a case where the counted value A by the counter 101b is not higher than or equal to the first count number (S305: No), the control unit 101 returns to S302. The control unit 101 repeatedly performs the processes from S302 to S304 until the counted value A by the counter 101b becomes higher than or equal to the first count number. It should be noted that the first count number may be a value higher than or equal to 1.

In S306, the control unit 101 controls the power supply unit 102 such that power output via the power supply antenna 107 is stopped. Thereafter, the control unit 101 ends the first test process illustrated in FIG. 3.

When it is determined that the counted value A by the counter 101b is higher than or equal to the first count number (S305: Yes), the control unit 101 performs the process in S306 and ends the first test process, but the first exemplary embodiment is not limited to this. For example, in a case where an instruction for ending the first test process is input to the power supply apparatus 100 via the operation unit 110, the control unit 101 may perform the process in S306 and end the first test process. In this case, when the instruction for ending the first test process is not input to the power supply apparatus 100 via the operation unit 110, the control unit 101 repeatedly performs the processes S302 and S303 until the instruction for ending the first test process is input.

Modulation Process

Figure 4:
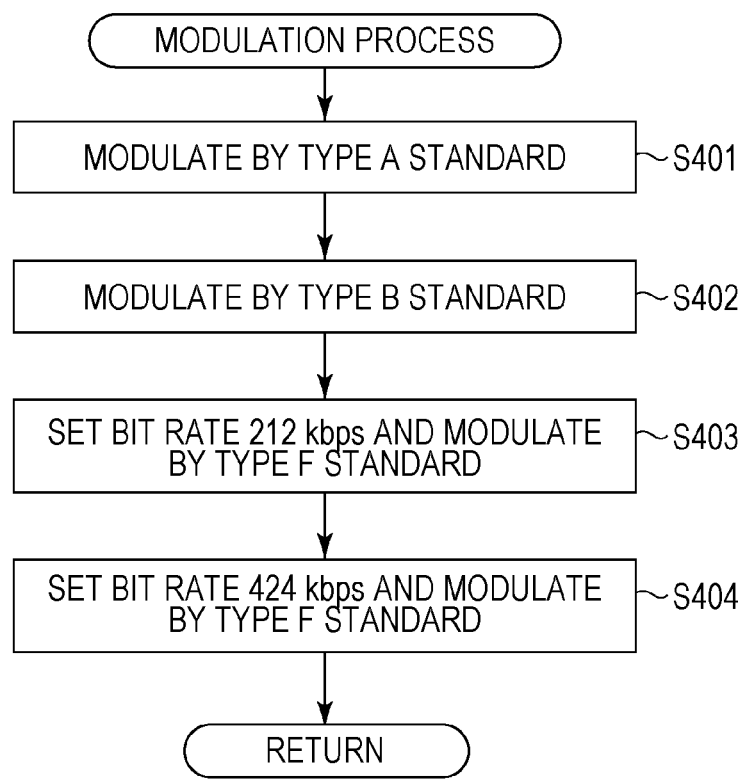
FIG. 4 is a flow chart illustrating an example of a modulation process according to the first exemplary embodiment.

Next, with reference to FIG. 4, the modulation process performed by the control unit 101 will be described. It should be noted that the modulation process illustrated in FIG. 4 can be realized while the control unit 101 executes the computer program stored in the memory 108.

In S401, the control unit 101 controls the communication unit 106 such that a modulation for superimposing a digital signal of pseudorandom noise (PN) 6 on the WC power is performed on the basis of the Type A standard. The digital signal of the PN6 has a date length calculated by Expression (1).

$$2^9 - 1 = 511 \quad (1)$$

In S401, the communication unit 106 performs the ASK modulation at the modulation rate of 100% on the WC power at the bit rate of 106 kbps such that the digital signal of the PN6 is superimposed on the WC power. Thereafter, the control unit 101 performs S402. In S402, the control unit 101 controls the communication unit 106 such that the modulation for superimposing the digital signal of the PN6 on the WC power is performed on the basis of the Type B standard. In S402, the communication unit 106 performs the ASK modulation at the modulation rate of 10% on the WC power at the bit rate of 106 kbps such that the digital signal of the PN6 is superimposed on the WC power. Thereafter, the control unit 101 performs S403.

In S403, the control unit 101 sets the bit rate at 212 kbps and controls the communication unit 106 such that the modulation for superimposing the digital signal of the PN6 on the WC power is performed on the basis of the Type F standard. In S403, the communication unit 106 performs the ASK modulation at the modulation rate of 10% on the WC power at the bit rate of 212 kbps such that the digital signal of the PN6 is superimposed on the WC power. Thereafter, the control unit 101 performs S404.

In S404, the control unit 101 sets the bit rate at 424 kbps and controls the communication unit 106 such that the modulation for superimposing the digital signal of the PN6 on the WC power is performed on the basis of the Type F standard. In S404, the communication unit 106 performs the ASK modulation at the modulation rate of 10% on the WC power at the bit rate of 424 kbps such that the digital signal of the PN6 is superimposed on the WC power. Thereafter, the control unit 101 ends the modulation process.

Figure 3:
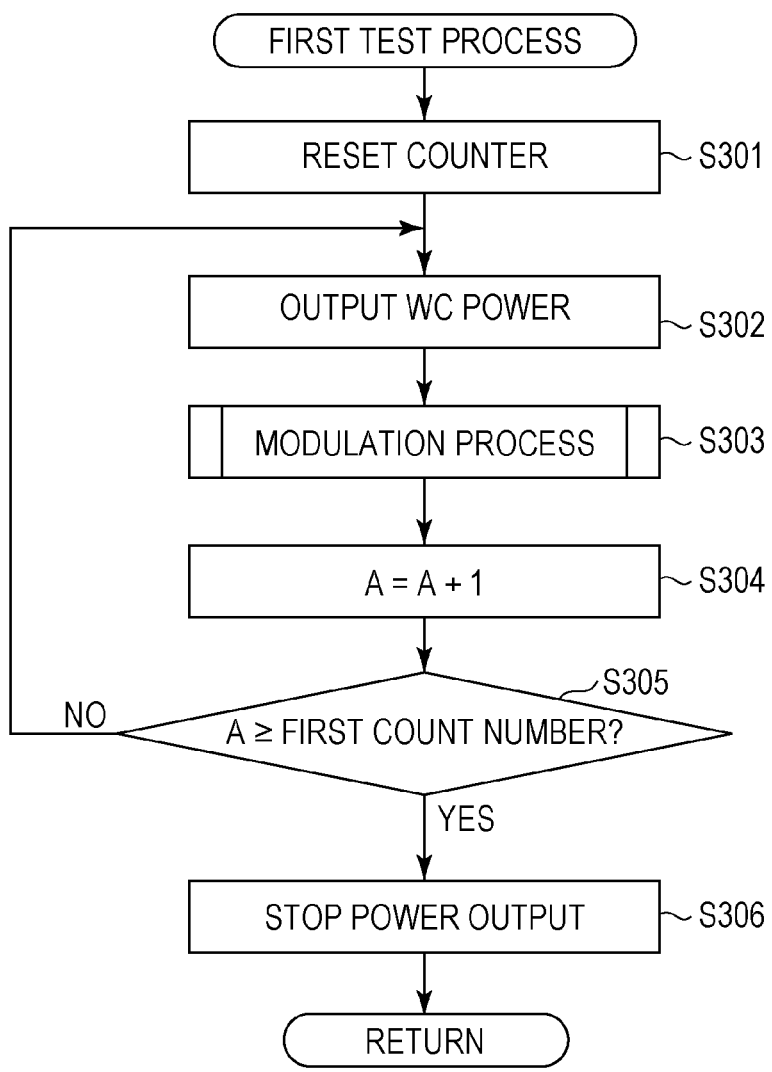
FIG. 3 is a flow chart illustrating an example of a first test process according to the first exemplary embodiment.
Figure 5:
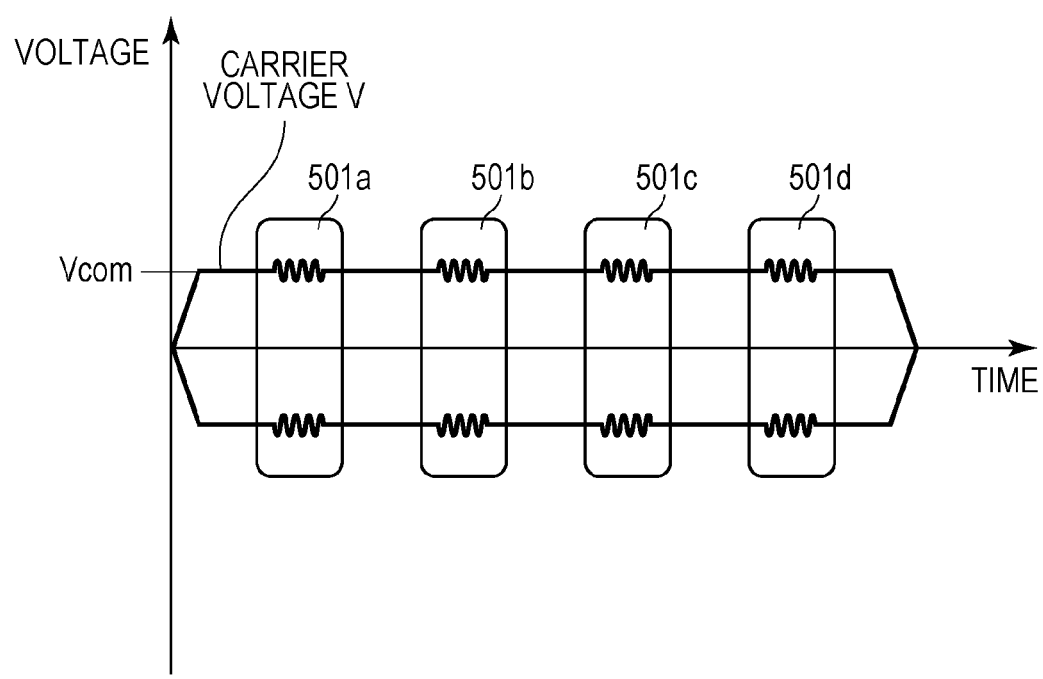
FIG. 5 illustrates an example of a change in power output from the power supply apparatus in a case where the first test process is performed.

Next, with reference to FIG. 5, descriptions will be given of an example of a change in power output from the power supply apparatus 100 in a case where the first test process illustrated in FIG. 3 is performed by the control unit 101. FIG. 5 illustrates a change in power output from the power supply apparatus 100 in a case where the first count number is set as "1".

In S302, the control unit 101 controls the power supply unit 102 such that the carrier voltage V of power output from the power supply antenna 107 is changed from "0" to the "communication voltage Vcom". The communication voltage Vcom is, for example, a voltage set on the basis of the communication protocol to which the communication unit 106 corresponds. Thereafter, in S401, the control unit 101 controls the communication unit 106 such that a digital signal 501a of the PN6 is superimposed on a carrier voltage V in accordance with the Type A standard. Thereafter, in S402, the control unit 101 controls the communication unit 106 such that a digital signal 501b of the PN6 is superimposed on the carrier voltage V in accordance with the Type B standard. Thereafter, in S403, the control unit 101 controls the communication unit 106 such that a digital signal 501c of the PN6 is superimposed on the carrier voltage V in accordance with the Type F standard. In S403, the control unit 101 controls the communication unit 106 such that the digital signal 501c of the PN6 is transmitted at the bit rate of 212 kbps. Thereafter, in S404, the control unit 101 controls the communication unit 106 such that a digital signal 501d of the PN6 is superimposed on the carrier voltage V in accordance with the Type F standard. In S404, the control unit 101 controls the communication unit 106 such that the digital signal 501d of the PN6 is transmitted at the bit rate of 424 kbps. Thereafter, in S306, the control unit 101 controls the power supply unit 102 such that the carrier voltage V of power output from the power supply antenna 107 is changed from a "communication voltage Vcom" to "0".

Second Test Process

Next, with reference to FIG. 6, the second test process performed by the control unit 101 in S206 will be described. It should be noted that the second test process illustrated in FIG. 6 can be realized while the control unit 101 executes the computer program stored in the memory 108.

In S601, the control unit 101 determines which power class the power supply apparatus 100 is based on by using the information recorded in the memory 108. Thereafter, the control unit 101 sets the WPS power in accordance with the power class on which the power supply apparatus 100 is based. For example, in a case where the power supply apparatus 100 is based on the low power class, the control unit 101 sets the WPS power at 1 [W]. In addition, for example, in a case where the power supply apparatus 100 is based on the middle power class, the control unit 101 sets the WPS power at 5 [W]. Moreover, for example, in a case where the power supply apparatus 100 is based on the high power class, the control unit 101 sets the WPS power at 10 [W]. After the WPS power is set, the control unit 101 performs S602.

In S602, the control unit 101 controls the power supply unit 102 such that the WPS power set in S601 is output via the power supply antenna 107. Thereafter, the control unit 101 performs S603.

In S603, the control unit 101 determines whether or not an instruction for ending the second test process is input to the power supply apparatus 100 via the operation unit 110. In a case where the instruction for ending the second test process is input to the power supply apparatus 100 via the operation unit 110 (S603: Yes), the control unit 101 performs S604. In a case where the instruction for ending the second test process is not input to the power supply apparatus 100 via the operation unit 110 (S603: No), the control unit 101 returns to S602. In this case, the control unit 101 repeatedly performs S602 until the instruction for ending the second test process is input.

In S604, the control unit 101 controls the power supply unit 102 such that power output via the power supply antenna 107 is stopped. Thereafter, the control unit 101 ends The second test process illustrated in FIG. 6.

Figure 6:
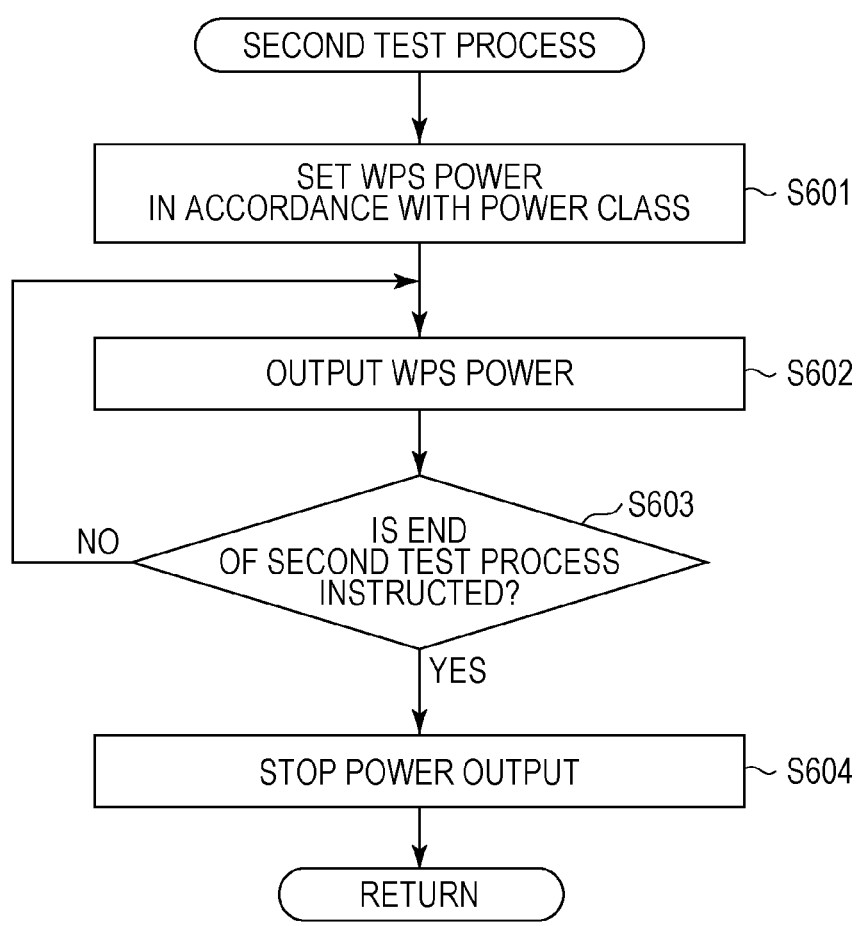
FIG. 6 is a flow chart illustrating an example of a second test process according to the first exemplary embodiment.
Figure 7:
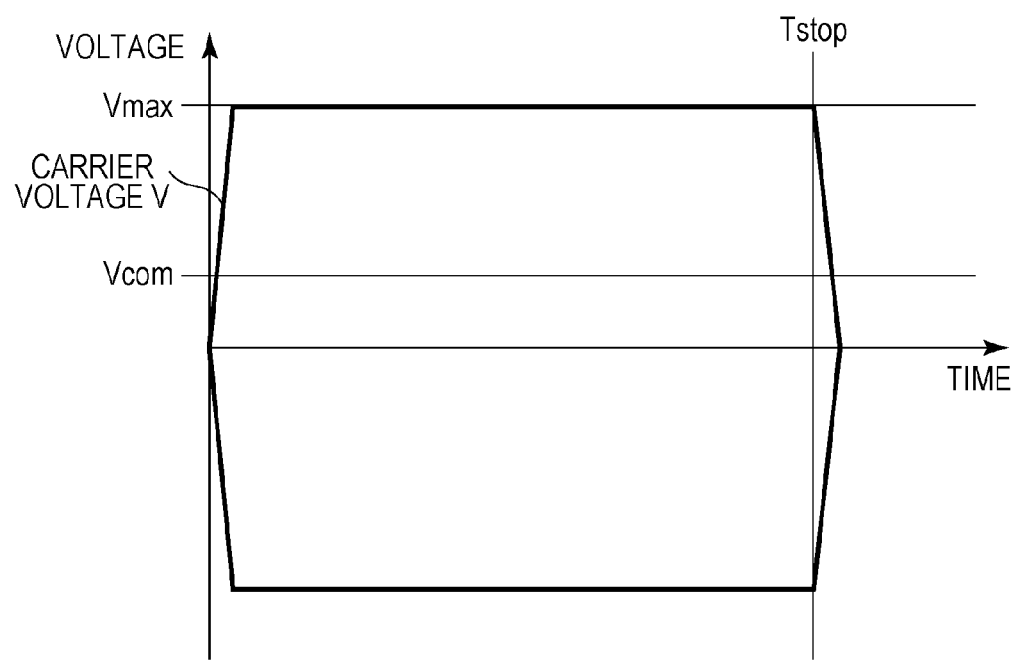
FIG. 7 illustrates an example of a change in power output from the power supply apparatus in a case where the second test process is performed.

Next, with reference to FIG. 7, descriptions will be given of an example of a change in power output from the power supply apparatus 100 in a case where the second test process illustrated in FIG. 6 is performed by the control unit 101. Tstop in FIG. 7 indicates a timing at which the instruction for ending the second test process is input to the power supply apparatus 100.

In S602, the control unit 101 controls the power supply unit 102 such that the carrier voltage V of power output from the power supply antenna 107 is changed from "0" to a "maximum voltage Vmax". The maximum voltage Vmax refers to a carrier voltage that becomes the maximum in a case where the WPS power is output from the power supply antenna 107. The maximum voltage Vmax is, for example, a voltage set on the basis of the power class on which the power supply apparatus 100 is based. Thereafter, the instruction for ending the second test process is input (Tstop in FIG. 7), in S604, the control unit 101 controls the power supply unit 102 such that the carrier voltage V of power output from the power supply antenna 107 is changed from the "maximum voltage Vmax" to "0". After S602 is executed, until the instruction for ending the second test process is input, the control unit 101 controls the power supply unit 102 such that the carrier voltage V of power output from the power supply antenna 107 becomes the "maximum voltage Vmax".

Third Test Process

Next, with reference to FIG. 8, the third test process performed by the control unit 101 in S207 will be described. It should be noted that the third test process illustrated in FIG. 8 can be realized while the control unit 101 executes the computer program stored in the memory 108.

In S801, the control unit 101 determines which power class the power supply apparatus 100 is based on by using the information recorded in the memory 108 similarly as in S601. Thereafter, the control unit 101 sets the WPS power in accordance with the power class on which the power supply apparatus 100 is based. After the WPS power is set, the control unit 101 performs S802.

In S802, the control unit 101 resets the counter 101b similarly as in S301. Thereafter, the control unit 101 performs S803.

In S803, the control unit 101 controls the power supply unit 102 such that the WC power is output via the power supply antenna 107 similarly as in S302. Thereafter, the control unit 101 performs S804. In S804, the control unit 101 performs the modulation process similarly as in S303. After the modulation process is performed, the control unit 101 performs S805.

In S805, the control unit 101 performs a first process for changing power output from the power supply antenna 107 from the WC power to the WPS power. After the first process is performed, the control unit 101 performs S806.

In S806, the control unit 101 controls the power supply unit 102 such that the WPS power set in S801 is output via the power supply antenna 107. Furthermore, the control unit 101 controls the timer 101a to measure the elapsed time since the output of WPS power. Thereafter, the control unit 101 performs S807.

In S807, the control unit 101 determines whether or not the time measured by the timer 101a has reached a predetermined time Tpre. In a case where the time measured by the timer 101a has reached the predetermined time Tpre (S807: Yes), the control unit 101 determines that the predetermined time Tpre has elapsed since the output of WPS power and performs S808. In a case where the time measured by the timer 101a has not reached the predetermined time Tpre (S807: No), the control unit 101 determines that the predetermined time Tpre has not elapsed since the output of WPS power and returns to S806. The predetermined time Tpre may be a previously set time or may be set in accordance with the power class on which the power supply apparatus 100 is based. In addition, the predetermined time Tpre may be a time that can be set via the operation unit 110.

In S808, the control unit 101 performs a second process for changing power output from the power supply antenna 107 from the WPS power to the WC power. After the second process is performed, the control unit 101 performs S809.

In S809, the control unit 101 controls the power supply unit 102 such that the WC power is output via the power supply antenna 107 similarly as in S302. Thereafter, the control unit 101 performs S810. In S810, the control unit 101 performs the modulation process similarly as in S303. After the modulation process is performed, the control unit 101 performs S811.

In S811, the control unit 101 controls the counter 101b such that 1 is added to a value B indicating the execution number of the process from S803 to S810 by the control unit 101. Thereafter, the control unit 101 performs S812.

In S812, the control unit 101 determines whether or not the counted value B by the counter 101b is higher than or equal to a second count number. In a case where the counted value B by the counter 101b is higher than or equal to the second count number (S812: Yes), the control unit 101 performs S813. In a case where the counted value B by the counter 101b is not higher than or equal to the second count number (S812: No), the control unit 101 returns to S803. The control unit 101 repeatedly performs the processes from S803 to S810 until the counted value B by the counter 101b becomes higher than or equal to the second count number. It should be noted that the second count number may be a value higher than or equal to 1.

In S813, the control unit 101 controls the power supply unit 102 such that power output via the power supply antenna 107 is stopped. Thereafter, the control unit 101 ends the third test process illustrated in FIG. 8.

When it is determined that the counted value B by the counter 101b is higher than or equal to the second count number (S812: Yes), the control unit 101 performs the process in S813 and ends the third test process, but the first exemplary embodiment is not limited to this. For example, in a case where an instruction for ending the third test process is input to the power supply apparatus 100 via the operation unit 110, the control unit 101 may perform the process in S813 and end the third test process. In this case, when the instruction for ending the third test process is not input to the power supply apparatus 100 via the operation unit 110, the control unit 101 repeatedly performs the processes from S803 to S810 until the instruction for ending the third test process is input.

Figure 8:
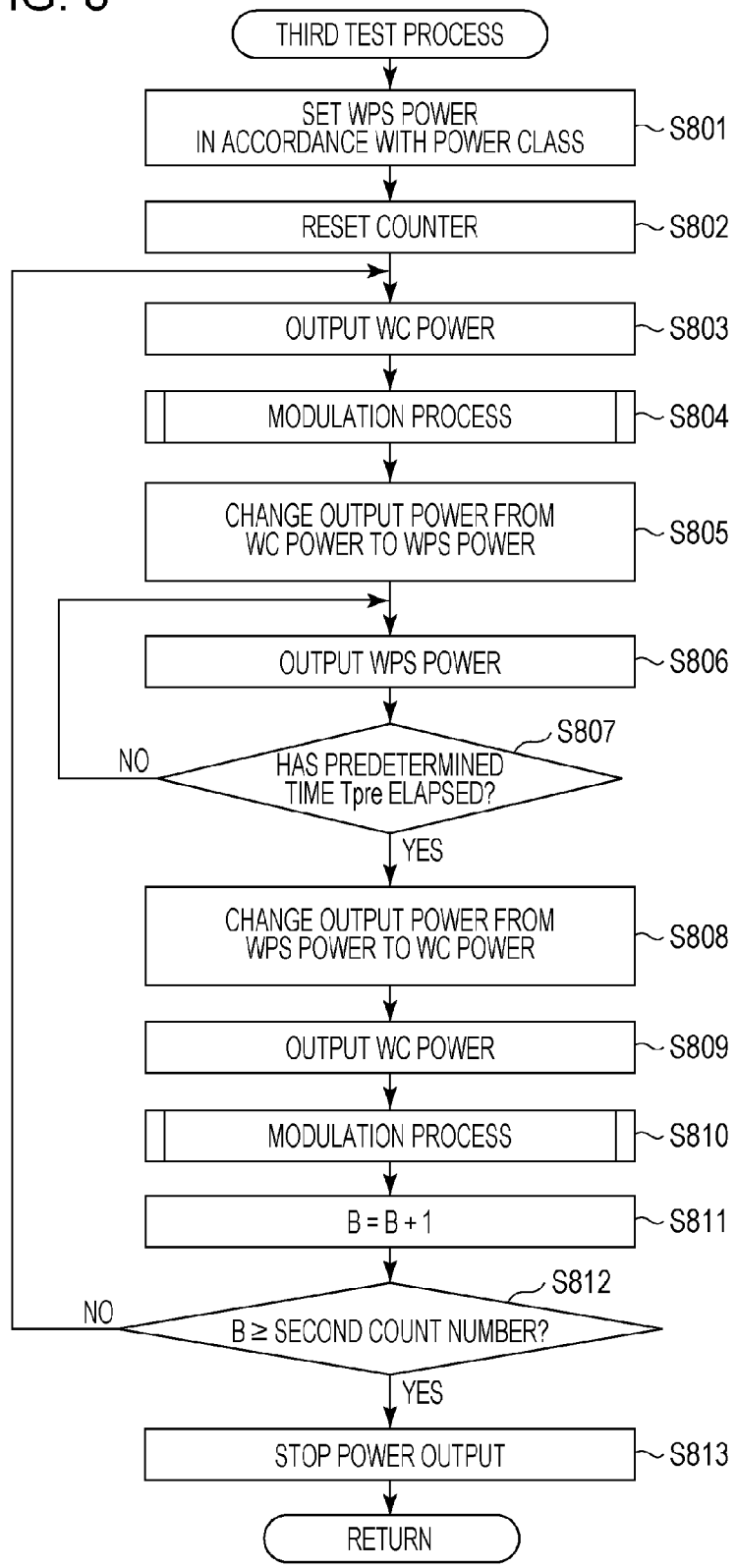
FIG. 8 is a flow chart illustrating an example of a third test process according to the first exemplary embodiment.
Figure 9:
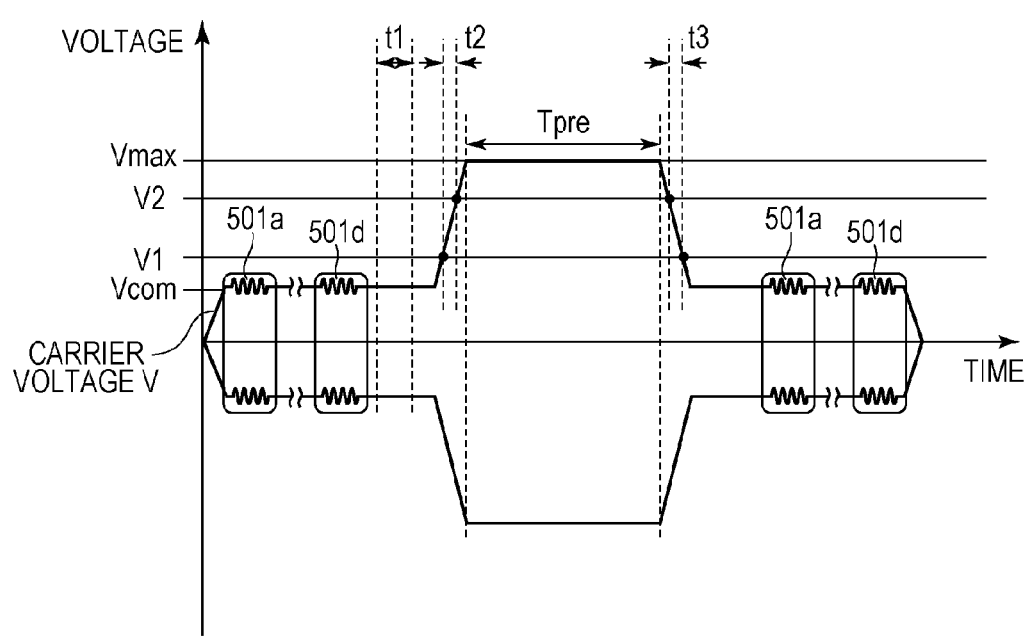
FIG. 9 illustrates an example of a change in power output from the power supply apparatus in a case where the third test process is performed.

Next, with reference to FIG. 9, descriptions will be given of an example of a change in power output from the power supply apparatus 100 in a case where the third test process illustrated in FIG. 8 is performed by the control unit 101. FIG. 9 illustrates a change in power output from the power supply apparatus 100 in a case where the second count number is set as "1".

In S803, the control unit 101 controls the power supply unit 102 such that the carrier voltage V of power output from the power supply antenna 107 is changed from "0" to the "communication voltage Vcom". Thereafter, in S401, the control unit 101 controls the communication unit 106 such that the digital signal 501a of the PN6 is superimposed on the carrier voltage V in accordance with the Type A standard. Thereafter, in S402, the control unit 101 controls the communication unit 106 such that the digital signal 501b of the PN6 is superimposed on the carrier voltage V in accordance with the Type B standard. Thereafter, in S403, the control unit 101 controls the communication unit 106 such that the digital signal 501c of the PN6 is superimposed on the carrier voltage V in accordance with the Type F standard. In S403, the control unit 101 controls the communication unit 106 such that the digital signal 501c of the PN6 is transmitted at the bit rate of 212 kbps. Thereafter, in S404, the control unit 101 controls the communication unit 106 such that the digital signal 501d of the PN6 is superimposed on the carrier voltage V in accordance with the Type F standard. In S404, the control unit 101 controls the communication unit 106 such that the digital signal 501d of the PN6 is transmitted at the bit rate of 424 kbps. Thereafter, the control unit 101 controls the communication unit 106 such that the modulation is not performed on the WC power supplied from the power generation unit 103 to the power supply antenna 107 after the modulation for superimposing the digital signal 501*d* of the PN6 on the WC power is ended.

Furthermore, in S404, the control unit 101 controls the timer 101*a* to measure an elapsed time after the end of the modulation of the WC power by the communication unit 106. In a case where the time measured by the timer 101*a* has reached a first time t1 in a state in which the modulation of the WC power by the communication unit 106 is not performed, that is, a state in which the data is not superimposed on the WC power, the control unit 101 determines that the first time t1 has elapsed and performs S805. In S805, the control unit 101 controls the power supply unit 102 such that the carrier voltage V of power output from the power supply antenna 107 is increased and performs a first process. The control unit 101 performs a process for controlling the power supply unit 102 as the first process such that a time when the carrier voltage V of power output from the power supply antenna 107 is changed from a "first voltage V1" to a "second voltage V2" is within a second time t2.

The first voltage V1 is calculated by using the following Expression (2).

$$V1 = V\text{com} + 0.1(V\text{max} - V\text{com}) \quad (2)$$

The second voltage V2 is calculated by using the following Expression (3).

$$V2 = V\text{max} - 0.1(V\text{max} - V\text{com}) \quad (3)$$

The second time t2 is a value of approximately several msec. The second time t2 is, for example, 10 [msec] or shorter.

After the first process is performed, the control unit 101 performs S806. In S806, the control unit 101 controls the power supply unit 102 such that the WPS power set in S801 is output from the power supply antenna 107. In a case where S806 is executed, the carrier voltage V of power output from the power supply antenna 107 is controlled to be set as the "maximum voltage Vmax". During a period until the predetermined time Tpre elapses since the output of WPS power from the power supply antenna 107 (S807: No), the control unit 101 controls the power supply unit 102 such that the WPS power set in S801 is output from the power supply antenna 107. In a case where the predetermined time Tpre has elapsed (S807: Yes), in S808, the control unit 101 controls the power supply unit 102 to decrease the carrier voltage V of power output from the power supply antenna 107 and performs the second process. The control unit 101 performs a process for controlling the power supply unit 102 as the second process such that a time when the carrier voltage V of power output from the power supply antenna 107 is changed from the "second voltage V2" to the "first voltage V1" is within a third time t3. The third time t3 is a value of approximately several msec. The third time t3 is, for example, 10 [msec] or shorter.

After the second process is performed, in S809, the control unit 101 controls the power supply unit 102 such that the WC power is output from the power supply antenna 107. In a case where S809 is executed, the carrier voltage V of power output from the power supply antenna 107 is controlled to be set as the "communication voltage Vcom". Thereafter, in S401, the control unit 101 controls the communication unit 106 such that the digital signal 501*a* of the PN6 is superimposed on the carrier voltage V in accordance with the Type A standard. Thereafter, in S402, the control unit 101 controls the communication unit 106 such that the digital signal 501*b* of the PN6 is superimposed on the carrier voltage V in accordance with the Type B standard. Thereafter, in S403, the control unit 101 controls the communication unit 106 such that the digital signal 501*c* of the PN6 is superimposed on the carrier voltage V in accordance with the Type F standard. In S403, the control unit 101 controls the communication unit 106 such that the digital signal 501*c* of the PN6 is transmitted at the bit rate of 212 kbps. Thereafter, in S404, the control unit 101 controls the communication unit 106 such that the digital signal 501*d* of the PN6 is superimposed on the carrier voltage V in accordance with the Type F standard. In S404, the control unit 101 controls the communication unit 106 such that the digital signal 501*d* of the PN6 is transmitted at the bit rate of 424 kbps. After the modulation for superimposing the digital signal 501*d* of the PN6 on the WC power is ended, in S813, the control unit 101 controls the power supply unit 102 such that the carrier voltage V of power output from the power supply antenna 107 is changed from the "communication voltage Vcom" to "0".

Fourth Test Process

Next, with reference to FIG. 10, the fourth test process performed by the control unit 101 in S208 will be described. It should be noted that the fourth test process illustrated in FIG. 10 can be realized while the control unit 101 executes the computer program stored in the memory 108.

In S1001, the control unit 101 determines which power class the power supply apparatus 100 is based on by using the information recorded in the memory 108 similarly as in S601. Thereafter, the control unit 101 sets the WPS power in accordance with the power class on which the power supply apparatus 100 is based. After the WPS power is set, the control unit 101 performs S1002.

In S1002, the control unit 101 resets the counter 101*b* similarly as in S301. Thereafter, the control unit 101 performs S1003. In S1003, the control unit 101 controls the power supply unit 102 such that the WC power is output via the power supply antenna 107 similarly as in S302. Thereafter, the control unit 101 performs S1004. In S1004, the control unit 101 performs the modulation process similarly as in S303. After the modulation process is performed, the control unit 101 performs S1005.

In S1005, the control unit 101 performs a restriction process for restricting power output from the power supply antenna 107. In S1005, the control unit 101 performs the restriction process during a period until a fourth time t4 elapses since the start of the restriction process. After the fourth time t4 has elapsed, the control unit 101 ends the restriction process and performs S1006. The fourth time t4 is, for example, a few seconds. In addition, the fourth time t4 may be a reset time specified in the communication protocol of the communication unit 106. The fourth time t4 may also be a time longer than the first time t1.

In S1006, the control unit 101 performs the first process similarly as in S805. After the first process is performed, the control unit 101 performs S1007.

In S1007, the control unit 101 controls the power supply unit 102 such that the WPS power set in S1001 is output via the power supply antenna 107. Furthermore, the control unit 101 controls the timer 101*a* to measure the elapsed time after the output of WPS power. Thereafter, the control unit 101 performs S1008.

In S1008, the control unit 101 determines whether or not the time measured by the timer 101*a* has reached the predetermined time Tpre. In a case where the time measured by the timer 101*a* has reached the predetermined time Tpre (S1008: Yes), S1009 is executed. In a case where the time measured by the timer 101a has not reached the predetermined time Tpre (S1008: No), the control unit 101 returns to S1007.

In S1009, the control unit 101 performs the second process similarly as in S808. After the second process is performed, the control unit 101 performs S1010.

In S1010, the control unit 101 performs the restriction process similarly as in S1005. In S1010, the control unit 101 performs the restriction process during a period until a fifth time t5 elapses since the start of the restriction process. After the fifth time t5 has elapsed, the control unit 101 ends the restriction process and performs S1011. The fifth time t5 is, for example, a few seconds. In addition, the fifth time t5 may be a reset time specified in the communication protocol of the communication unit 106. The fifth time t5 may also be a time longer than the first time t1. The fifth time t5 may also be the same time as the fourth time t4 and may be a time different from the fourth time t4.

In S1011, the control unit 101 controls the power supply unit 102 such that the WC power is output via the power supply antenna 107 similarly as in S302. Thereafter, the control unit 101 performs S1012. In S1012, the control unit 101 performs the modulation process similarly as in S303. After the modulation process is performed, the control unit 101 performs S1013.

In 1013, the control unit 101 performs the restriction process similarly as in S1005. In S1010, the control unit 101 performs the restriction process during a period until a sixth time t6 elapses since the start of the restriction process. After the sixth time t6 has elapsed, the control unit 101 ends the restriction process and performs S1014. The sixth time t6 may be the same time as the fourth time t4 and may also be a time different from the fourth time t4. The sixth time t6 may be the same time as the fifth time t5 and may also be a time different from the fifth time t5.

In S1014, the control unit 101 controls the counter 101b such that 1 is added to a value C indicating the execution number of the process from S1003 to S1013 by the control unit 101. Thereafter, the control unit 101 performs S1015.

In S1015, the control unit 101 determines whether or not the counted value C by the counter 101b is higher than or equal to a third count number. In a case where the counted value C by the counter 101b is higher than or equal to the third count number (S1015: Yes), the control unit 101 performs S1016. In a case where the counted value C by the counter 101b is not higher than or equal to the third count number (S1015: No), the control unit 101 returns to S1003. The control unit 101 repeatedly performs the processes from S1003 to S1013 until the counted value C by the counter 101b becomes higher than or equal to the third count number. It should be noted that the third count number may be a value higher than or equal to 1.

In S1016, the control unit 101 controls the power supply unit 102 such that power output via the power supply antenna 107 is stopped. Thereafter, the control unit 101 ends the fourth test illustrated in FIG. 10.

When it is determined that the counted value C by the counter 101b is higher than or equal to the third count number (S1015: Yes), the control unit 101 performs the process in S1016 and ends the fourth test process, but the first exemplary embodiment is not limited to this. For example, in a case where an instruction for ending the fourth test process is input to the power supply apparatus 100 via the operation unit 110, the control unit 101 may perform the process in S1016 and end the fourth test process. In this case, when the instruction for ending the fourth test process is not input to the power supply apparatus 100 via the operation unit 110, the control unit 101 repeatedly performs the processes from S1003 to S1013 until the instruction for ending the fourth test process is input.

Figure 10:
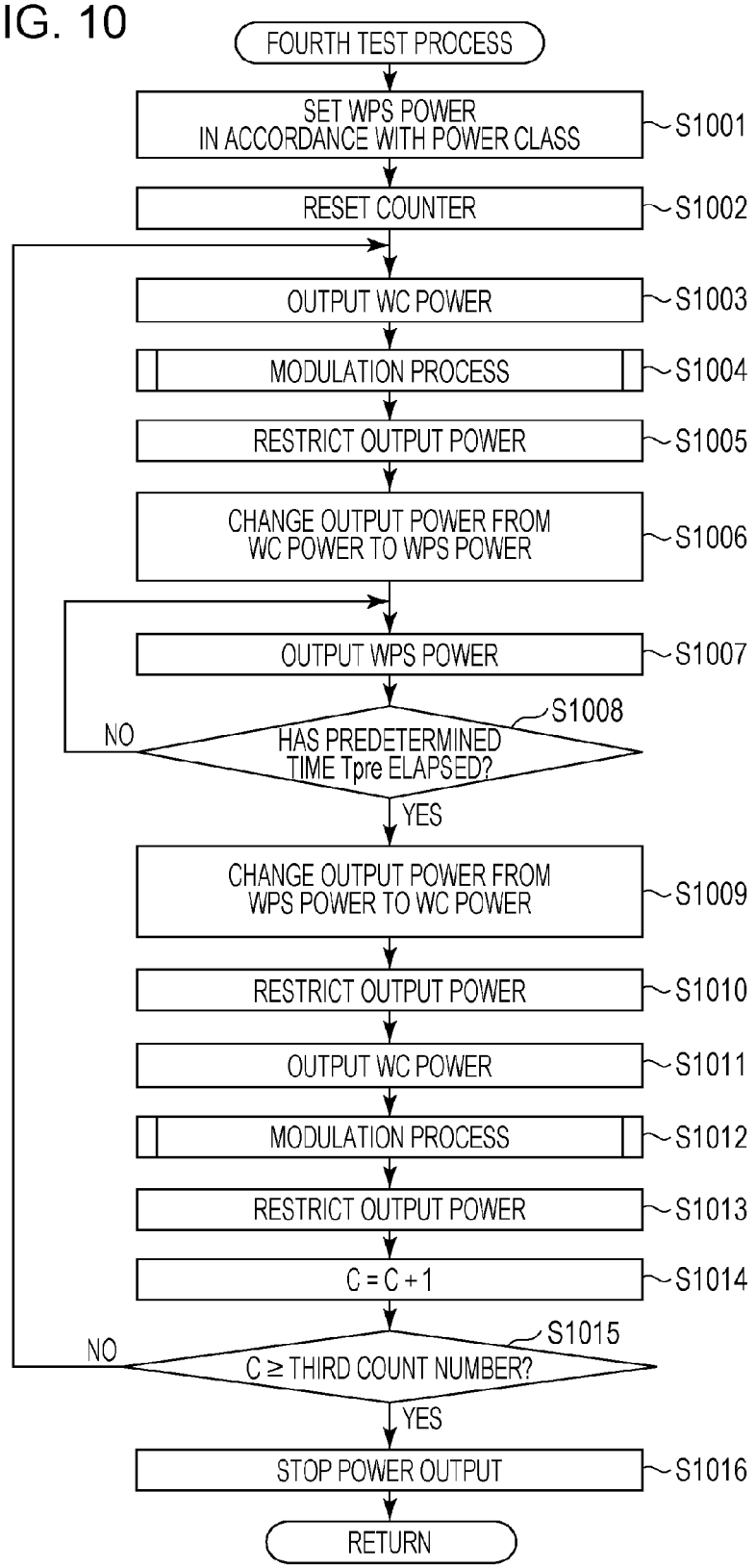
FIG. 10 is a flow chart illustrating an example of a fourth test process according to the first exemplary embodiment.
Figure 11:
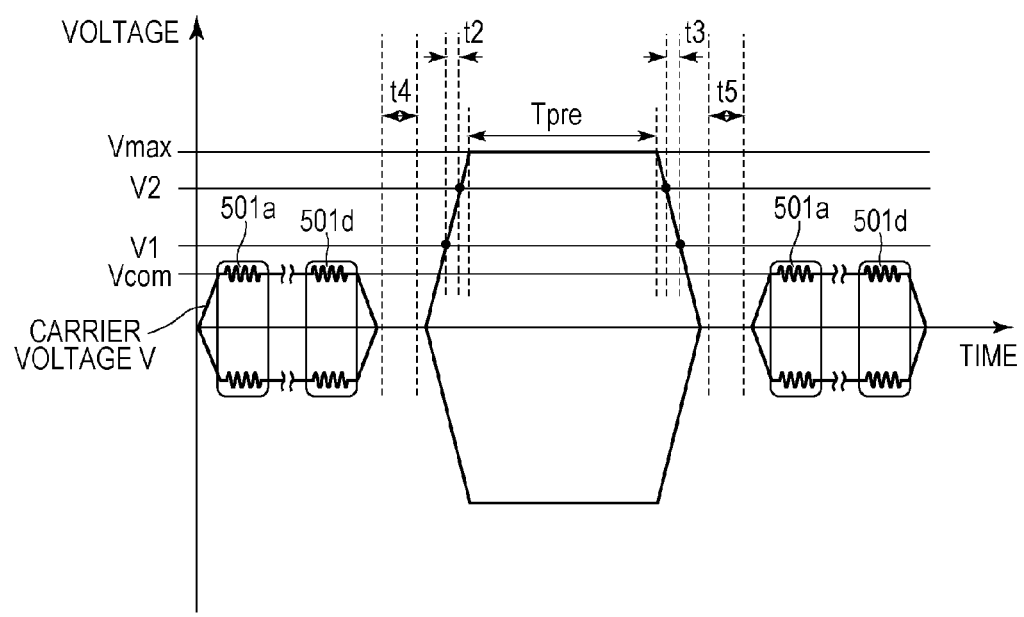
FIG. 11 illustrates an example of a change in power output from the power supply apparatus in a case where the fourth test process is performed.

Next, with reference to FIG. 11, descriptions will be given of an example of a change in power output from the power supply apparatus 100 in a case where the fourth test illustrated in FIG. 10 is performed by the control unit 101. FIG. 11 illustrates a change in power output from the power supply apparatus 100 in a case where the third count number is set as "1".

In S1003, the control unit 101 controls the power supply unit 102 such that the carrier voltage V of power output from the power supply antenna 107 is changed from "0" to the "communication voltage Vcom". Thereafter, in S401, the control unit 101 controls the communication unit 106 such that the digital signal 501a of the PN6 is superimposed on the carrier voltage V in accordance with the Type A standard. Thereafter, in S402, the control unit 101 controls the communication unit 106 such that the digital signal 501b of the PN6 is superimposed on the carrier voltage V in accordance with the Type B standard. Thereafter, in S403, the control unit 101 controls the communication unit 106 such that the digital signal 501c of the PN6 is superimposed on the carrier voltage V in accordance with the Type F standard. In S403, the control unit 101 controls the communication unit 106 such that the digital signal 501c of the PN6 is transmitted at the bit rate of 212 kbps. Thereafter, in S404, the control unit 101 controls the communication unit 106 such that the digital signal 501d of the PN6 is superimposed on the carrier voltage V in accordance with the Type F standard. In S404, the control unit 101 controls the communication unit 106 such that the digital signal 501d of the PN6 is transmitted at the bit rate of 424 kbps. after the modulation for superimposing the digital signal 501d of the PN6 on the WC power is ended, the control unit 101 performs S1005.

In S1005, the control unit 101 performs the restriction process such that the carrier voltage V of power output from the power supply antenna 107 is set to be lower than the "communication voltage Vcom". The control unit 101 controls the communication unit 106 such that the modulation of the WC power is not performed as the restriction process and controls the power supply unit 102 such that the WC power is not output from the power supply antenna 107. Furthermore, the control unit 101 controls the timer 101a to measure the elapsed time since the start of the restriction process. In a case where the time measured by the timer 101a has reached the fourth time t4 in a state in which the restriction process is performed, the control unit 101 determines that the fourth time t4 has elapsed and performs S1006.

In S1006, the control unit 101 performs the first process similarly as the third test process illustrated in FIG. 8. After the first process is performed, the control unit 101 performs S1007. In S1007, the control unit 101 controls the power supply unit 102 such that the WPS power set in S1001 is output from the power supply antenna 107. In a case where S1007 is executed, the carrier voltage V of power output from the power supply antenna 107 is controlled to be set as the "maximum voltage Vmax". During a period until the predetermined time Tpre elapses since the output of WPS power from the power supply antenna 107 (S1008: No), the control unit 101 controls the power supply unit 102 such that the WPS power set in S1001 is output from the power supply antenna 107. In a case where the predetermined time Tpre has elapsed since the output of WPS power from the power supply antenna 107 (S1008: Yes), the control unit 101 performs S1009.

In S1009, the control unit 101 performs the second process similarly as in the third test process illustrated in FIG. 8. After the second process is performed, the control unit 101 performs S1010. In S1010, the control unit 101 performs the restriction process such that the carrier voltage V of power output from the power supply antenna 107 is set to be lower than the "communication voltage Vcom". Furthermore, the control unit 101 controls the timer 101*a* to measure the elapsed time since the start of the restriction process. In a case where the time measured by the timer 101*a* has reached the fifth time t5 in a state in which the restriction process is performed, the control unit 101 determines that the fifth time t5 has elapsed and performs S1011.

In S1011, the control unit 101 controls the power supply unit 102 such that the WC power is output from the power supply antenna 107. In a case where S1011 is executed, the carrier voltage V of power output from the power supply antenna 107 is controlled to be set as the "communication voltage Vcom". Thereafter, in S401, the control unit 101 controls the communication unit 106 such that the digital signal 501*a* of the PN6 is superimposed on the carrier voltage V in accordance with the Type A standard. Thereafter, in S402, the control unit 101 controls the communication unit 106 such that the digital signal 501*b* of the PN6 is superimposed on the carrier voltage V in accordance with the Type B standard. Thereafter, in S403, the control unit 101 controls the communication unit 106 such that the digital signal 501*c* of the PN6 is superimposed on the carrier voltage V in accordance with the Type F standard. In S403, the control unit 101 controls the communication unit 106 such that the digital signal 501*c* of the PN6 is transmitted at the bit rate of 212 kbps. Thereafter, in S404, the control unit 101 controls the communication unit 106 such that the digital signal 501*d* of the PN6 is superimposed on the carrier voltage V in accordance with the Type F standard. In S404, the control unit 101 controls the communication unit 106 such that the digital signal 501*d* of the PN6 is transmitted at the bit rate of 424 kbps. Thereafter, in S1013, the control unit 101 performs the restriction process after the modulation for superimposing the digital signal 501*d* of the PN6 on the WC power is ended.

Furthermore, in S404, the control unit 101 controls the timer 101*a* to measure the elapsed time since the start of the restriction process. In a case where the time measured by the timer 101*a* has reached the sixth time t6 in a state in which the restriction process is performed, the control unit 101 determines that the sixth time t6 has elapsed and performs S1016. In S1016, the control unit 101 controls the power supply unit 102 such that the carrier voltage V of power output from the power supply antenna 107 is changed from the "communication voltage Vcom" to "0".

Power Supply Process

Next, with reference to FIG. 12, a power supply process performed by the control unit 101 in S209 will be described. It should be noted that the power supply process illustrated in FIG. 12 can be realized while the control unit 101 performs the computer program stored in the memory 108.

In S1201, the control unit 101 controls the power supply unit 102 such that the WC power is output via the power supply antenna 107 similarly as in S302. Thereafter, the control unit 101 performs S1202. In S1202, the control unit 101 controls the communication unit 106 such that a device that exists in a predetermined range is searched for in accordance with one of the Type A standard, the Type B standard, and the Type F standard. Thereafter, the control unit 101 performs S1203. The search for the device that exists in the predetermined range will be hereinafter referred to as "polling".

In a case where the device that exists in the predetermined range corresponds to one of the Type A standard, the Type B standard, and the Type F standard, the device that exists in the predetermined range transmits the response signal to the polling to the power supply apparatus 100 in accordance with the corresponding communication standard. For example, in S1201, in a case where the communication unit 106 performs the polling in accordance with the Type A standard, when the device that exists in the predetermined range corresponds to the Type A standard, the device that exists in the predetermined range transmits the response signal in accordance with the Type A standard. It should be noted that, for example, in S1201, in a case where the communication unit 106 performs the polling in accordance with the Type A standard, when the device that exists in the predetermined range does not correspond to the Type A standard, the device that exists in the predetermined range does not transmit the response signal.

In view of the above, in S1203, the control unit 101 determines whether or not the communication unit 106 receives a response signal to the polling. In a case where the communication unit 106 receives the response signal to the polling (S1203: Yes), the control unit 101 performs S1204. In a case where the communication unit 106 receives the response signal to the polling (S1203: Yes), the control unit 101 controls the communication unit 106 such that a wireless communication is established with a device that transmits the response signal. In a case where the communication unit 106 does not receive the response signal to the polling (S1203: No), the control unit 101 repeatedly performs S1202. In a case where S1202 is executed again, the control unit 101 controls the communication unit 106 such that the communication standard is changed to another communication standard, and the polling is performed again.

In S1204, the control unit 101 determines whether or not the device where a wireless communication is established in S1203 is a device that can receive supplied power. For example, the control unit 101 controls the communication unit 106 such that data for inquiring on whether or not the device where the wireless communication is established is the device that can receive supplied power is transmitted. Thereafter, in a case where the communication unit 106 receives a response indicating that this device is the device that can receive supplied power from the device where the wireless communication is established, the control unit 101 determines that the device where the wireless communication is established is the device that can receive supplied power. On the other hand, in a case where the communication unit 106 does not receive the response indicating that this device is the device that can receive supplied power from the device where the wireless communication is established, the control unit 101 determines that the device where the wireless communication is established is not the device that can receive supplied power. In addition, in a case where the communication unit 106 receives a response indicating that this device is not the device that can receive supplied power from the device where the wireless communication is established, the control unit 101 determines that the device where the wireless communication is established determines that the device that can receive supplied power. When it is determined that the device where the wireless communication is established is the device that can receive supplied power (S1204: Yes), the control unit 101 performs S1205.

When it is determined that the device where the wireless communication is established is not the device that can receive supplied power (S1204: No), the control unit 101 performs S1211. When it is determined that the device where the wireless communication is established is the device that can receive supplied power (S1204: Yes), the control unit 101 determines that the device that exists in the predetermined range is the power receiving device 200.

In S1205, the control unit 101 determines whether or not the wireless power supply is requested from the power receiving device 200. For example, the control unit 101 controls the communication unit 106 such that the power receiving device 200 transmits data for inquiring on whether or not the wireless power supply is requested. Thereafter, in a case where a response indicating that the power receiving device 200 requests the wireless power supply is received, the control unit 101 determines that the wireless power supply is requested from the power receiving device 200. On the other hand, in a case where the communication unit 106 does not receive the response indicating that the power receiving device 200 requests the wireless power supply from the power receiving device 200, the control unit 101 determines that the wireless power supply is not requested from the power receiving device 200. In addition, in a case where the communication unit 106 receives a response indicating that the power receiving device 200 does not request the wireless power supply from the power receiving device 200, the control unit 101 determines that the wireless power supply is not requested from the power receiving device 200.

When it is determined that the power receiving device 200 requests the wireless power supply (S1205: Yes), the control unit 101 performs S1206. When it is determined that the power receiving device 200 does not request the wireless power supply (S1205: No), the control unit 101 performs S1211.

When it is not determined that the device that exists in the predetermined range is the power receiving device 200 and also that the device that exists in the predetermined range requests the wireless power supply, the power supply apparatus 100 determines that authentication for performing the wireless power supply is completed. It should be noted that, when it is not determined that the device exists in the predetermined range (S1203: No), the power supply apparatus 100 determines that the authentication for performing the wireless power supply is not completed. When it is not determined that the device that exists in the predetermined range is the power receiving device 200 corresponding to the device that can receive supplied power (S1204: No), the power supply apparatus 100 determines that the authentication for performing the wireless power supply is not completed. When it is not determined that the power receiving device 200 that exists in the predetermined range requests the wireless power supply (S1205: No), the power supply apparatus 100 determines that the authentication for performing the wireless power supply is not completed.

Since it is determined that the authentication for performing the wireless power supply is completed by performing the process from S1202 to S1205, the power supply apparatus 100 performs S1206 to output the WPS power to the power receiving device 200.

In S1206, the control unit 101 sets the WPS power and the predetermined time in accordance with the power class on which the power supply apparatus 100 is based and information indicating a status of the power receiving device 200. The information indicating the status of the power receiving device 200 includes information indicating power consumption of the power receiving device 200 and information indicating a remaining capacitance of a battery connected to the power receiving device 200. The information indicating the status of the power receiving device 200 is obtained from the power receiving device 200 by the communication unit 106. After the WPS power and the predetermined time Tpre are set, the control unit 101 performs S1207. It should be noted that, in S1206, the control unit 101 may set the WPS power and the predetermined time in accordance with a power class on which the power receiving device 200 is based in addition to the power class on which the power supply apparatus 100 is based and the information indicating the status of the power receiving device 200.

In S1207, the control unit 101 performs the first process similarly as in S805. After the first process is performed, the control unit 101 performs S1208.

In S1208, the control unit 101 controls the power supply unit 102 such that the WPS power set in S1206 is output via the power supply antenna 107. Furthermore, the control unit 101 controls the timer 101a to measure the elapsed time after the output of WPS power. Thereafter, the control unit 101 performs S1209.

In S1209, the control unit 101 determines whether or not the time measured by the timer 101a has reached the predetermined time Tpre set in S1206. In a case where the time measured by the timer 101a has reached the predetermined time Tpre (S1209: Yes), S1210 is executed. In a case where the time measured by the timer 101a has not reached the predetermined time Tpre (S1209: No), the control unit 101 returns to S1208.

In S1210, the control unit 101 performs the second process similarly as in S808. After the second process is performed, the control unit 101 performs S1202.

In S1211, the control unit 101 controls the power supply unit 102 such that power output via the power supply antenna 107 is stopped. Thereafter, the control unit 101 ends the power supply process illustrated in FIG. 12.

In this manner, the power supply apparatus 100 according to the first exemplary embodiment has the first test mode, the second test mode, the third test mode, and the fourth test mode as the test mode for efficiently perform the test when the apparatus is shipped as the product.

Figure 12:
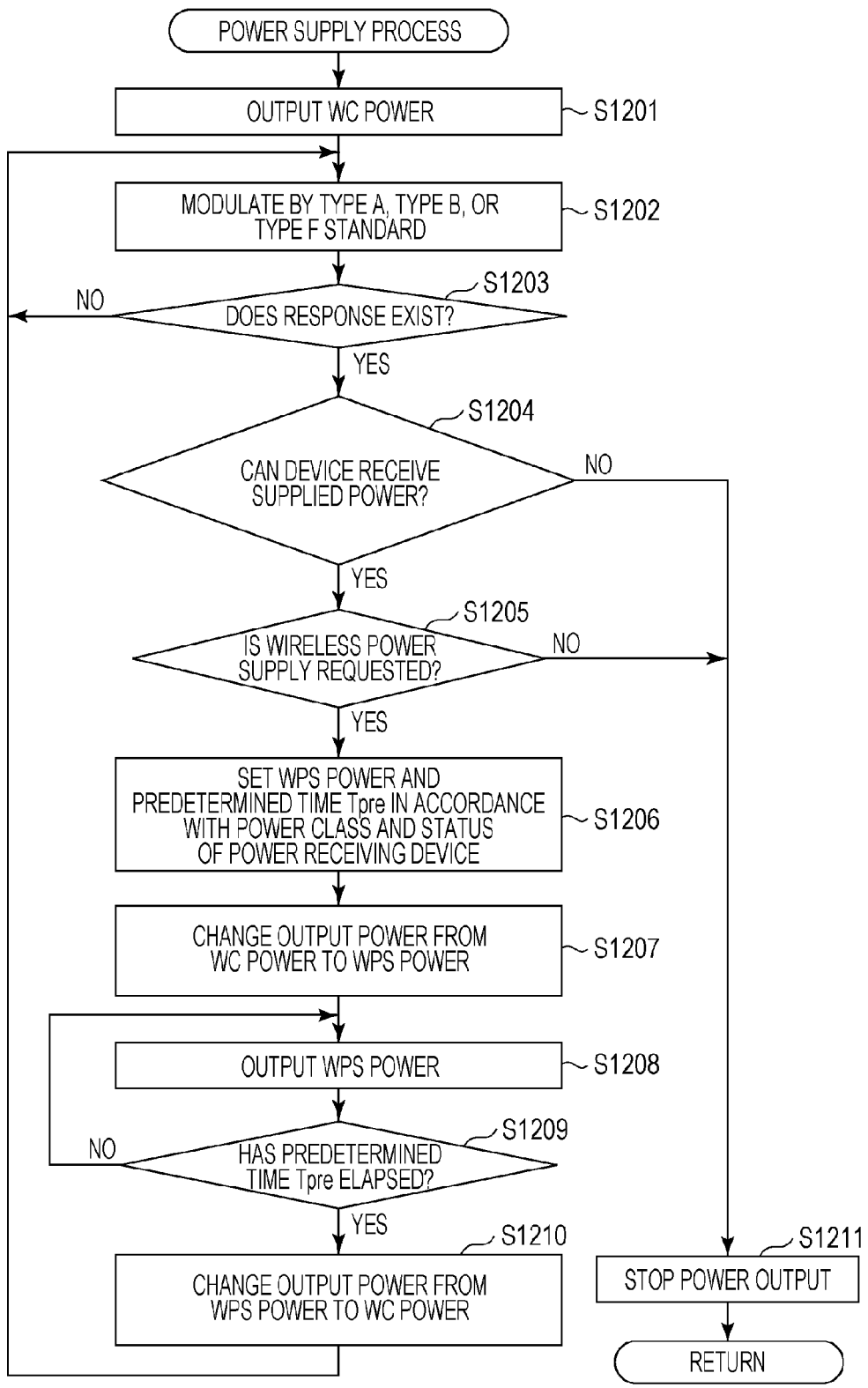
FIG. 12 is a flow chart illustrating an example of a power supply process according to the first exemplary embodiment.

In a case where one of the second test mode, the third test mode, and the fourth test mode is used, the power supply apparatus 100 can output the WPS power without performing the process from S1202 to S1205 that is performed in the power supply process illustrated in FIG. 12. For this reason, for the test performed when the power supply apparatus 100 is shipped, the power receiving device 200 does not need to be prepared in the factory, and the power supply apparatus 100 does not need to perform the process from S1202 to S1205.

Therefore, even when the power supply apparatus 100 does not perform the process from S1202 to S1205, the power supply apparatus 100 can efficiently perform the test for determining whether or not the wireless power supply can be appropriately performed. In addition, the power supply apparatus 100 according to the first exemplary embodiment can easily measure at least one of the electric field intensity and the magnetic field intensity in a case where the WPS power and the WC power are output in a time division manner from the power supply apparatus 100 by using the third test mode and the fourth test mode. Accordingly, the power supply apparatus 100 can efficiently perform a test for determining whether or not the WPS power and the WC power can be appropriately output in the time division manner to the power receiving device 200.

According to the first exemplary embodiment, the descriptions have been given while the communication unit 106 is based on the Type A standard, the Type B standard, and the Type F standard, but the communication unit 106 may be based on at least one of the Type A standard, the Type B standard, and the Type F standard. In this case, the control unit 101 causes the communication unit 106 to perform the modulation in accordance with the communication standard on which the communication unit 106 is based in the modulation process illustrated in FIG. 4.

According to the first exemplary embodiment, the descriptions have been given while the control unit 101 performs the third test process and the fourth test process, but the control unit 101 may execute only one of the third test process and the fourth test process.

According to the first exemplary embodiment, the control unit 101 controls the resonance frequency of the power supply apparatus 100 in a case where the WPS power is output and the resonance frequency of the power supply apparatus 100 in a case where the WC power is output to have the same predetermined frequency f, but the first exemplary embodiment is not limited to this. The control unit 101 may control the resonance frequency of the power supply apparatus 100 in a case where the WPS power is output to have a different frequency from the resonance frequency of the power supply apparatus 100 in a case where the WC power is output. For example, the control unit 101 may control the resonance frequency of the power supply apparatus 100 in a case where the WPS power is output to be set as 6.78 MHz and control the resonance frequency of the power supply apparatus 100 in a case where the WC power is output to be set as 13.56 MHz. In addition, for example, the control unit 101 may control the resonance frequency of the power supply apparatus 100 in a case where the WPS power is output to be set as a frequency in a range of 100 to 205 KHz. Moreover, for example, the control unit 101 may control the resonance frequency of the power supply apparatus 100 in a case where the WPS power is output to be set as a frequency in a range of 270 to 360 KHz.

It should be noted that, according to the first exemplary embodiment, the power supply apparatus 100 outputs the WPS power via the power supply antenna 107 and performs the communication based on the communication unit 106 by using the power supply antenna 107, but the first exemplary embodiment is not limited to this. For example, the power supply apparatus 100 may have a configuration in which an antenna for outputting the WPS power and an antenna for outputting the WC power are separately provided, and the output of WPS power and the output of the WC power are performed in a time division manner. The power supply apparatus 100 having the above-described configuration can attain a similar effect to the above-described effect by performing the test process, the first test process, the modulation process, the second test process, the third test process, and the fourth test process illustrated in FIG. 2, FIG. 3, FIG. 4, FIG. 6, FIG. 8, and FIG. 10.

Second Exemplary Embodiment

The power supply apparatus according to the present invention is not limited to the power supply apparatus 100 described in the first exemplary embodiment. For example, the power supply apparatus according to the present invention can also be realized by a system constituted by apparatuses.

Furthermore, at least one of the various functions, processes, and methods described in the first embodiment can be achieved using a program. Hereinafter, in a second embodiment, a program for realizing at least one of the various functions, processes, and methods described in the first embodiment will be referred to as a "program X". Furthermore, in the second embodiment, a computer for executing the program X will be referred to as a "computer Y". Examples of the computer Y include a personal computer, a microcomputer, and a central processing unit (CPU).

At least one of the various functions, processes, and methods described in the first embodiment can be realized by the computer Y executing the program X. In this case, the program X is supplied to the computer Y via a computer readable storage medium. A computer readable storage medium in the second embodiment includes at least one of a hard disk device, a magnetic storage device, an optical storage device, a magneto-optical storage device, a memory card, a read only memory (ROM), and a random access memory (RAM). Furthermore, the computer readable storage medium in the second embodiment is a non-transitory storage medium.

While the present invention is described with reference to exemplary embodiments, it is to be understood that the present invention is not limited to the exemplary embodiments. The scope of the following claims is to be accorded the broadest interpretation so as to encompass all modifications and equivalent structures.

This application claims priority from Japanese Patent Application No. 2014-240623, filed Nov. 27, 2014, which is hereby incorporated by reference herein in its entirety.

What is claimed is:

1. A power supply apparatus comprising:
a power supply unit that outputs first power used for wireless communication or second power used for wireless power supply;
a communication unit that performs a wireless communication by modulating the first power output from the power supply unit; and
a control unit that controls the second power output from the power supply unit after executing authentication processing for wireless power supply with an external apparatus in a case where the power supply apparatus is in a power supply mode,
wherein the control unit does not control the second power output from the power supply unit until completion of the authentication processing for the wireless power supply with the external apparatus in the case where the power supply apparatus is in the power supply mode, and
wherein the control unit controls the second power output from the power supply unit without executing the authentication processing for the wireless power supply with the external apparatus in a case where the power supply apparatus is in a test mode.

2. The power supply apparatus according to claim 1, wherein, in a case where the power supply apparatus is in the test mode, the control unit controls the communication unit in a manner that the first power is modulated in accordance with a corresponding communication standard of the communication unit when the first power is output from the power supply unit.

3. The power supply apparatus according to claim 1, wherein, in a case where the power supply apparatus is in the test mode, the control unit controls the communication unit in a manner that the first power is modulated in accordance with a bit rate corresponding to a corresponding communication standard of the communication unit when the first power is output from the power supply unit.

4. The power supply apparatus according to claim 1,
wherein the control unit can set the second power in accordance with a maximum value of power that can be output by the power supply unit, and
wherein, in a case where the power supply apparatus is in the test mode, the power supply unit outputs the second power set by the control unit.

5. The power supply apparatus according to claim 1, wherein, in a case where the power supply apparatus is in the test mode, the control unit controls the power supply unit in a manner that, after a first time elapses since the modulation of the first power is ended, power output from the power supply unit is changed from the first power to the second power.

6. The power supply apparatus according to claim 1, wherein, in a case where the power supply apparatus is in the test mode and a case where power output from the power supply unit is changed from the first power to the second power, the control unit controls the power supply unit in a manner that a time when a carrier voltage of power output from the power supply unit is changed from a first voltage to a second voltage that is higher than the first voltage is within a second time.

7. The power supply apparatus according to claim 6, wherein, in a case where the power supply apparatus is in the test mode and a case where power output from the power supply unit is changed from the second power to the first power, the control unit controls the power supply unit in a manner that a time when the carrier voltage of power output from the power supply unit is changed from the second voltage to the first voltage is within a third time.

8. The power supply apparatus according to claim 6, wherein, in a case where the power supply apparatus is in the test mode and a case where power output from the power supply unit is changed from the first power to the second power, the control unit controls the power supply unit in a manner that, after the carrier voltage of power output from the power supply unit is changed to a voltage lower than the first voltage, the carrier voltage of power output from the power supply unit is changed to the second voltage.

9. The power supply apparatus according to claim 6, wherein, in a case where the power supply apparatus is in the test mode and a case where power output from the power supply unit is changed from the first power to the second power, the control unit controls the power supply unit in a manner that, after the output of power via the power supply unit is stopped, the carrier voltage of power output from the power supply unit is changed to the second voltage.

10. The power supply apparatus according to claim 6, wherein, in a case where the power supply apparatus is in the test mode and a case where power output from the power supply unit is changed from the second power to the first power, the control unit controls the power supply unit in a manner that, after the carrier voltage of power output from the power supply unit is changed to a voltage lower than a communication voltage that is lower than the first voltage, the carrier voltage of power output from the power supply unit is changed to the communication voltage.

11. The power supply apparatus according to claim 6, wherein, in a case where the power supply apparatus is in the test mode and a case where power output from the power supply unit is changed from the second power to the first power, the control unit controls the power supply unit in a manner that, after the output of power via the power supply unit is stopped, the carrier voltage of power output from the power supply unit is changed to a communication voltage that is lower than the first voltage.

12. A method comprising:
causing a power supply unit to output first power used for wireless communication or second power used for wireless power supply;
performing a wireless communication by modulating the first power output from the power supply unit; and
controlling the second power output from the power supply unit after executing authentication processing for wireless power supply with an external apparatus in a case where the power supply apparatus is in a power supply mode,
wherein the control unit does not control the second power output from the power supply unit until completion of the authentication processing for the wireless power supply with the external apparatus in the case where the power supply apparatus is in the power supply mode, and
wherein the control unit controls the second power output from the power supply unit without executing the authentication processing for the wireless power supply with the external apparatus in a case where the power supply apparatus is in a test mode.

13. A non-transitory storage medium that stores a program for causing a computer to execute a method, the method comprising:
causing a power supply unit to output first power used for wireless communication or second power used for wireless power supply;
performing a wireless communication by modulating the first power output from the power supply unit; and
controlling the second power output from the power supply unit after executing authentication processing for wireless power supply with an external apparatus in a case where the power supply apparatus is in a power supply mode,
wherein the control unit does not control the second power output from the power supply unit until completion of the authentication processing for the wireless power supply with the external apparatus in the case where the power supply apparatus is in the power supply mode, and
wherein the control unit controls the second power output from the power supply unit without executing the authentication processing for the wireless power supply with the external apparatus in a case where the power supply apparatus is in a test mode.

* * * * *